United States Patent [19]

Kulkarni et al.

[11] Patent Number: 4,824,521

[45] Date of Patent: Apr. 25, 1989

[54] PLANARIZATION OF METAL PILLARS ON UNEVEN SUBSTRATES

[75] Inventors: Vivek D. Kulkarni, Sunnyvale; Egil D. Castel, Cupertino, both of Calif.

[73] Assignee: Fairchild Semiconductor Corporation, Cupertino, Calif.

[21] Appl. No.: 33,961

[22] Filed: Apr. 1, 1987

[51] Int. Cl.⁴ .............................. B44C 1/22; C23F 1/00
[52] U.S. Cl. ...................................... 156/643; 156/629; 156/630; 156/632; 156/634; 156/656; 156/662; 156/664; 156/665
[58] Field of Search ............... 156/629, 630, 632, 634, 156/643, 656, 662, 664, 665

[56] References Cited

U.S. PATENT DOCUMENTS

| | | | |
|---|---|---|---|
| 4,299,680 | 11/1981 | Fontana, Jr. et al. | 204/192.34 |
| 4,374,159 | 2/1983 | Pitetti et al. | 156/664 |
| 4,451,326 | 5/1984 | Gwozdz | 156/656 |
| 4,654,113 | 3/1987 | Tuchiya et al. | 156/643 |
| 4,661,204 | 4/1987 | Mathur et al. | 156/629 |
| 4,708,770 | 11/1987 | Pasch | 156/662 |

Primary Examiner—David L. Lacey
Assistant Examiner—Lori-Ann Johnson
Attorney, Agent, or Firm—Lee Patch; Robert C. Colwell; James M. Heslin

[57] ABSTRACT

A method for forming vertical metal interconnects on a semiconductor substrate having an uneven surface comprises first forming a laminated metal structure over the entire substrate. The laminated metal structure includes a first metallization sublayer, an intermediate etch stop barrier layer, and a second metallization sublayer. Usually, a barrier layer will be formed between the substrate and the laminated metal structure. The laminated metal structure is then patterned into the desired vertical metal interconnects, which interconnects are at different elevations because of the uneven underlying surface. The vertical metal interconnects are then planarized by first applying a dielectric layer and a sacrificial layer, etching back the combined dielectric and sacrificial layers to expose only the higher vertical metal interconnects, and then selectively etching back the second metal sublayer component of the higher vertical metal interconnects. By properly choosing the thicknesses of the various layers in the laminated metal structure, vertical metal interconnects having substantially identical elevations will be created.

21 Claims, 3 Drawing Sheets

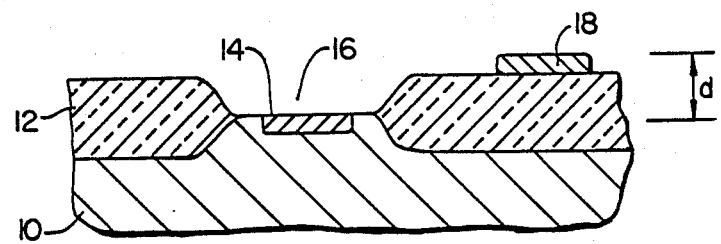
FIG._1.
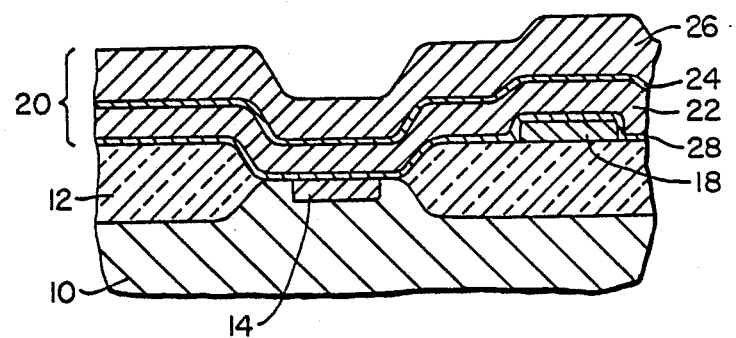
FIG._2.
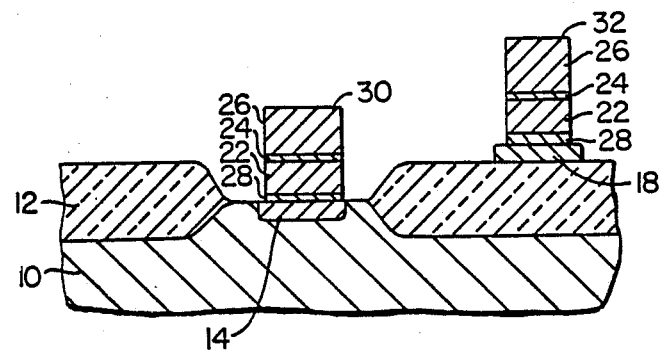
FIG._3.

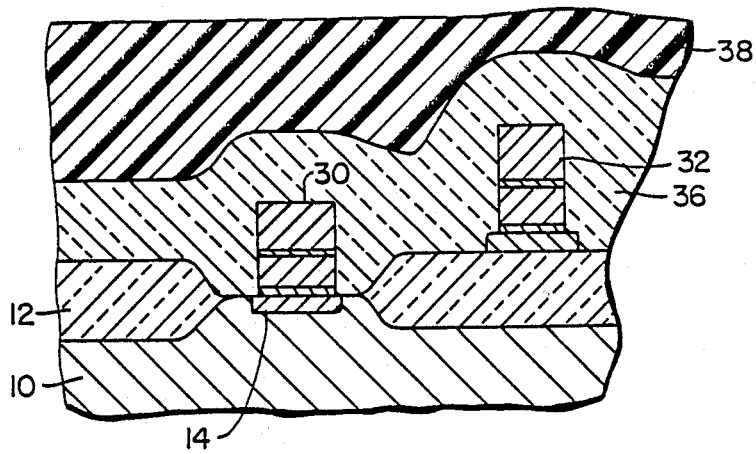
FIG._4.
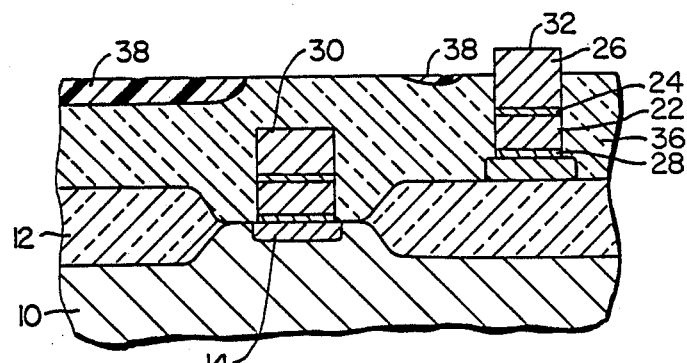
FIG._5.
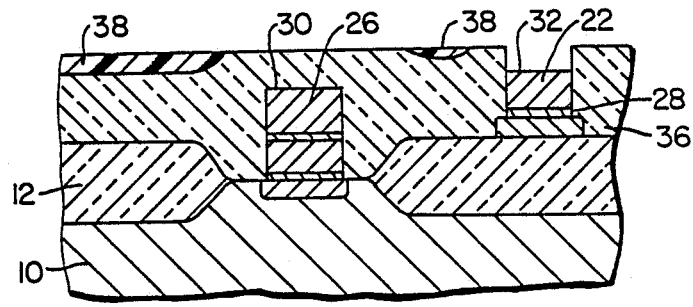
FIG._6.

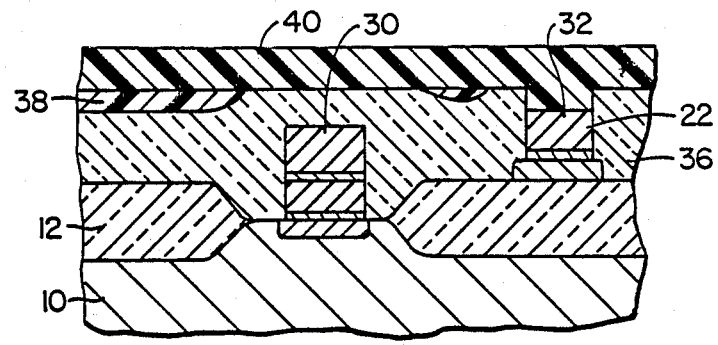
FIG._7.
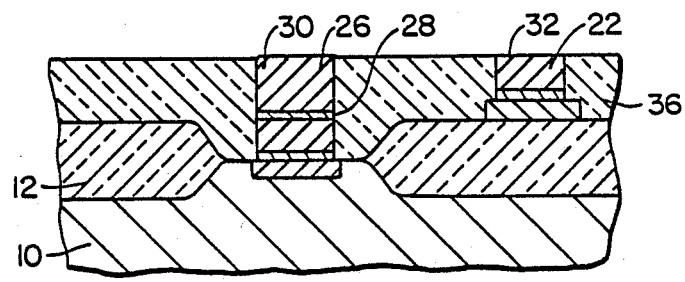
FIG._8.
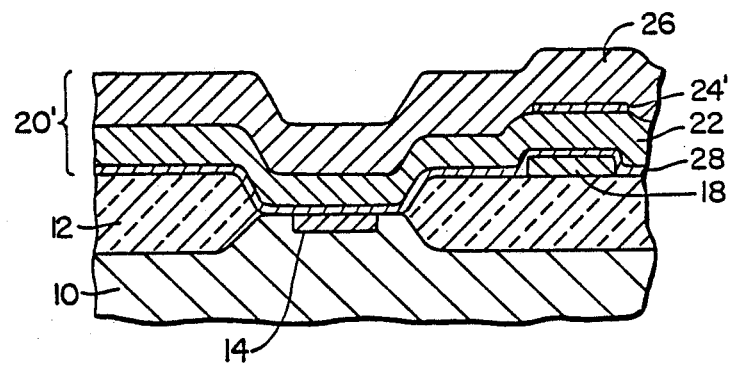
FIG._9.

PLANARIZATION OF METAL PILLARS ON UNEVEN SUBSTRATES

BACKGROUND OF THE INVENTION

The present invention relates generally to semiconductor fabrication techniques, and more particularly to methods for planarizing metal pillars which are formed over regions of the semiconductor substrate, which regions are at differing heights.

Integrated circuits are generally formed as layered structures where a plurality of insulating and conductive layers are formed over a silicon wafer substrate having numerous active regions formed thereon. As integrated circuits become increasingly complex, the density of active regions formed on the surface becomes greater and greater. One limit on the density of such features, however, is the ability to form very fine metallization lines over the insulating layers which are stacked over the substrate. To form such fine metallization lines, it is necessary that the insulating layers be planarized to present a smooth and even surface on which the lines are to be patterned. While a variety of etch-back techniques have been developed to achieve such planarization, such techniques are not always effective and there is a continuing need to improve planarization methods for particular circumstances.

The present invention is concerned primarily with the planarization of metal pillars employed as vertical interconnects between various active regions on the semiconductor substrate and an overlying metallization layer. The pillars are formed by depositing a metal layer over the substrate, and the thickness of the metal layer will be substantially the same over all flat areas of the substrate. Thus, the tops of the pillars which are subsequently formed over regions having different elevations will themselves terminate at different elevations.

For the above reasons, it is desirable to provide improved methods for planarizing metal pillars formed on semiconductor substrates, particularly where difference in height between such pillars is magnified by relatively large variations in the surface of the substrate. It would be particularly desirable if such methods were useful not only for interconnecting the substrate with an overlying metallization layer, but also for interconnecting successive horizontal metallization layers which are separated by an intermediate dielectric layer.

SUMMARY OF THE INVENTION

The present invention provides an improved method for simultaneously forming a plurality of vertical metal interconnects, usually referred to as pillars or posts, over different regions on a semiconductor substrate having an uneven surface. The vertical metal interconnects are formed from a laminated metal structure which is applied over the substrate and which conforms to the uneven surface. Without special provision for planarization, the vertical metal interconnects formed by patterning this laminated metal structure would terminate at different heights depending on the elevation of the region over which the interconnect is formed.

The laminated metal structure of the present invention includes a first (lower) metal layer, a thin intermediate etch stop layer, and a second (upper) metal layer. The first metal layer lies closest to the substrate and has a thickness approximately equal to the intermetallic dielectric thickness over the highest regions on the substrate. The thickness of the second metal layer is selected to be substantially equal to the expected difference in height between higher and lower regions on the substrate over which the vertical metal interconnects are to be formed. In this way, the heights of the interconnects can be equalized by removing the second metal layer from the higher interconnects, as described in more detail hereinbelow. The intermediate etch stop layer is thin and formed directly over the first metallization layer relative to the metallization layers, and the second metallization layer is formed directly over the intermediate etch stop barrier layer.

The vertical metal interconnects are patterned in the laminated metal structure by photolithographic techniques, resulting in individual interconnects having differing heights relative to a fixed plane through the semiconductor substrate. The higher vertical metal interconnects can be reduced in height, however, by selectively etching them back to the etch stop barrier which remains in the vertical interconnect after patterning.

The method just described is adequate for planarizing vertical metal interconnects when a group of those interconnects generally lie at one of two elevations on the uneven surface of the substrate. The invention can be extended to planarizing vertical metal interconnects lying at three or more different elevations simply by increasing the number of etch stop barriers within the laminated metal structure, where those etch stop barriers are located based on the expected differences in height between the various regions to be connected.

In the preferred embodiment of the present invention, a first aluminum or aluminum alloy layer is applied over the substrate, conforming to its uneven surface. As described above, the thickness of the first layer is approximately equal to the thickness of the intermetallic dielectric over the highest regions on the substrate. A relatively thin etch stop barrier, typically tungsten-titanium or other suitable refractory material, is applied over the first aluminum layer, and a second aluminum layer applied over the etch stop barrier layer. The combined thicknesses of the etch stop barrier and the second aluminum layer will also be equal to the expected difference in height between the high and low regions to be connected. After the vertical metal interconnects are patterned, a dielectric layer is formed over the substrate, covering all the metal interconnects. A sacrificial layer is applied over the dielectric layer, and the combined sacrificial and dielectric layers are etched back under conditions which result in planarization of the dielectric layer. The etch back is stopped after the higher vertical metal interconnects are exposed, but before exposing the lower vertical metal interconnects. The higher vertical metal interconnects are then selectively etched back to the etch stop barrier, and a second sacrificial layer applied over the planarized dielectric. The combined sacrificial layer and dielectric layer are again etched back to expose all of the vertical metal interconnects which are now at approximately the same elevations. The semiconductor structure is then ready for additional conventional processing, typically the formation of a metallization layer to interconnect the vertical metal interconnect lines.

BRIEF DESCRIPTION OF THE DRAWINGS

FIG. 1 illustrates a typical integrated circuit structure having an uneven substrate surface which may be processed according to the method of the present invention.

FIGS. 2-8 illustrate the preferred method of the present invention for forming and planarizing vertical metal interconnects on the structure of FIG. 1.

FIG. 9 illustrates an alternate embodiment of the step illustrated in FIG. 2.

DESCRIPTION OF THE SPECIFIC EMBODIMENTS

Referring to FIG. 1, the method of the present invention is particularly useful with metal oxide semiconductor (MOS) structures, typically including a silicon substrate 10, an isolation (field) oxide 12 formed over the substrate 10, and a source or drain junction 14 formed on the substrate 10 in a depression or valley 16 formed in the field oxide 12. A gate electrode, typically polysilicon, is defined having an extension 18 formed over the isolation oxide 12, and it is necessary to be able to provide vertical metal interconnects, usually referred to as posts or pillars, to connect both the source/drain region 14 and the extension 18 of the gate electrode to an overlying metallization layer (not illustrated).

The present invention provides a method for forming such vertical metal interconnects so that the upper ends of the interconnects terminate within a reasonable tolerance of a preselected plane spaced above the isolation oxide layer 12. Because the source/drain region 14 is formed within a depression 16, there will be a height or elevation difference "d" between the upper surface of the polysilicon gate extension 18 and the source/drain region 14. It will be appreciated that a metallization layer applied directly over the structure of FIG. 1 will have an uneven surface corresponding generally to the uneven surface of the substrate 10 and oxide 12. Formation of metal pillars from such a metallization layer will result in pillars having upper ends at different elevations, that is, upper ends which are spaced at different distances relative to a fixed reference plane through the substate 10. It is the purpose of the present invention to provide a method for planarizing the upper ends of such vertical metal interconnect pillars on regions having differing elevations so that the pillars will be able to connect with a single metallization layer formed over the substrate in a relatively flat plane.

Referring now to FIGS. 2-8, the preferred method of the present invention for planarizing vertical metal interconnects formed over regions of varying elevations on a semiconductor substrate will be described in detail. Referring in particular to FIG. 2, a laminated metal structure 20 includes a first metallization layer 22, an etch stop barrier layer 24, and a second metallization layer 26. Usually, a refractory barrier layer 28 will be formed directly over the semiconductor substrate including the isolation oxide layer 12, active region 14, and polysilicon gate extension 18.

Typically, the barrier layer 28 will be a tungsten-titanium alloy having a thickness of approximately 500 to 2000 Å, usually being about 1000 Å. The first metallization layer 22 will be aluminum or aluminum-silicon having a thickness of approximately 3000 to 7000 Å, usually being about 5000 Å, while the etch stop barrier will be tungsten or a tungsten-titanium alloy having a thickness of about 500 to 1000 Å, usually being about 700 Å. The second metallization layer will also be aluminum or aluminum-silicon and have a thickness of approximately 3500 to 5500 Å, usually being about 4500 Å. All the layers just described are conveniently applied by conventional sputter-deposition techniques, and the preferred thicknesses are given to correspond to a difference d in elevation of approximately 5000 Å. As described previously, the distance d will be approximately the same as the thickness of the second aluminum layer.

Referring now to FIG. 3, after the laminated metal structure 20 has been deposited, vertical metal interconnects 30 and 32 are formed over desired active regions on the semiconductor in order to eventually provide interconnection with an overlying metallization layer. The vertical interconnects 30 and 32 are formed by conventional anisotropic patterning techniques, typically reactive ion etching. The aluminum-silicon layers are etched in a chlorine-containing plasma, while the tungsten and tungsten-titanium layers are etched in a fluorine-containing plasma. In some cases, it may be necessary to etch the bottom tungsten-titanium barrier layer 28 in a wet etchant, such as a mixture of hydrogen peroxide and ammonium hydroxide.

After patterning, each of the vertical metal interconnects 30 and 32 still comprises a four layer structure including the barrier layer 28, the first metallization layer 22, the intermediate etch stop barrier layer 24, and first second metallization layer 26.

Referring now to FIG. 4, a dielectric layer 36, typically comprising chemical vapor deposited silicon dioxide, is applied over the semiconductor to an average thickness of approximately 1 $\mu$m (10,000 Å). The profile of the dielectric layer 36, of course, will be affected by the underlying topography so that bumps in the dielectric will occur over the vertical metal interconnects, as illustrated. Such bumps must be diminished or eliminated prior to applying an overlying metallization layer, as will be described in detail hereinbelow.

A sacrificial layer 38 is applied over the dielectric layer for the purpose of planarization. Typically, the sacrificial layer 38 will be a spincoated organic polymer, more typically a photoresist. The photoresist will also have an average thickness of approximately 1 $\mu$m and is smoothed with a suitable heat treatment.

Referring now to FIG. 5, the combined dielectric layer 36 and sacrificial layer 38 are anisotropically etched back in a suitable plasma etchant. Typically, a combined fluorine, oxygen, and argon plasma is used in a parallel plate reactor in order to ensure that the etching occurs evenly in both the silicon dioxide dielectric and the organic photoresist, resulting in retention of the flat surface. The etch back is continued until a preselected portion of the higher vertical metal interconnect 32 is exposed, while a preselected thickness of the dielectric remains over the lower vertical metal interconnect 30. Conveniently, at least about 1000 Å, usually about 2500 Å of the higher vertical metal interconnect 32 is exposed, while a thickness of at least about 1000 Å, usually about 2500 Å of dielectric 36 remains over the lower vertical interconnect 30.

After exposing the higher vertical metal interconnect 32, the first metallization layer 26 is etched and completely removed in a chlorine-containing plasma, followed by etching and removal of the etch stop barrier layer 24 in a fluorine-containing plasma so that the dielectric material covering the lower vertical metal interconnect 30 is not substantially eroded in these steps. After such removal, the structure illustrated in FIG. 6 remains with the upper surface of the first metallization layer 22 exposed and at substantially the same elevation as the upper surface of the second metallization layer 26 of the lower vertical metal interconnect.

Referring now to FIG. 7, a second sacrificial layer 40 is applied over the structure of FIG. 6. Again, the planarization material is typically an organic polymer, such as a photoresist, which is spin-coated and heated to enhance the planarity of the surface. The thickness of the layer will be approximately 1 μm.

The combined second sacrificial layer 40, the remaining portions of the first sacrificial layer 38, and the upper surface of the dielectric layer 36 are then etched back, again in a fluorine, oxygen, and argon-containing plasma etch, until the upper surface of both the lower vertical metal interconnect 30 and the upper surface of the higher vertical metal interconnect 32 are exposed, as illustrated in FIG. 8. It will be appreciated that the upper surface of the higher vertical metal interconnect 32 is now defined by the upper surface of the first metallization layer 22, while the upper surface of the lower vertical metal interconnect is defined by the upper surface of the second metallization layer 26. By properly choosing the thicknesses of each of the various layers, it can be assured that the upper surfaces of both the higher and lower vertical metal interconnects can be planarized to approximately the same elevation.

Referring now to FIG. 9, an alternate approach for applying the etch stop barrier layer 28 will be described. The structure illustrated in FIG. 9 is substantially similar to that illustrated in FIG. 2 except that the laminated metal structure 20' includes an etch stop barrier layer 24' which is defined only over the higher regions on the substrate 10, such as the polysilicon gate region 18. The etch stop barrier layer 24' may be formed using conventional lithographic patterning techniques. As the etch stop barrier 24' is necessary only within the higher vertical metal interconnects, it need not be formed over the entire upper surface of the first metallization layer 22, as previously described.

Other modifications of the method of the present invention may also be practiced. For example, more than one etch stop barrier might be applied in the laminated metal structure 20 of FIG. 1. This would be an advantage when regions at more than two elevations are to be interconnected to a single overlying metallization layer. Another variation involves the etching back of the higher vertical metal interconnect, as illustrated in FIGS. 5 and 6. By employing a non-critical mask which exposes only the higher vertical metal interconnect, the amount of dielectric left covering the lower vertical metal interconnect 30 can be greatly reduced. This is because the dielectric is no longer necessary to protect the interconnect from the etching.

Although the foregoing invention has been described in some detail by way of illustration and example for purposes of clarity of understanding, it will be obvious that certain changes and modifications may be practiced within the scope of the appended claims.

What is claimed is:

1. A method for forming vertical metal interconnect over a substrsate having an uneven surface, said method comprising:
    forming a first metallization layer generally conforming to the surface of the substrate;
    forming an etch stop barrier layer over at least selected regions of the first metallization layer, wherein said selected regions are at differing elevations as a result of the uneven substrate surface;
    forming a second metallization layer generally conforming to the etch stop barrier layer and the first metallization layer;
    patterning the combined first and second metallization layers and etch stop barrier layer to define vertical metal interconnects over regions having different elevations and forming said vertical metal interconnects; and
    selectively etching those vertical metal interconnects having higher elevations and having a thickness approximately equal to the variation in elevation on the uneven substrate surface, back to the etch stop barrier layer overlying the first metallization layer.

2. A method as in claim 1, wherein a refractory barrier layer is formed over the substrate prior to forming the first metallization layer.

3. A method as in claim 1, wherein the thickness of the first metallization layer is approximately equal to the thickness of an intermetallic dielectric layer which is subsequently applied over the highest regions on the substrate.

4. A method as in claim 1, wherein the etch stop barrier layer is formed over the entire surface of the first metallization layer.

5. A method as in claim 1, wherein the etch stop barrier layer is formed only over the higher substrate regions which will have higher metal interconnects formed thereover.

6. A method as in claim 1, wherein the combined metallization layer and etch stop barrier layer are patterned by reactive ion etching through a photoresist mask.

7. A method for forming vertical metal interconnects over a substrate having an uneven surface, said method comprising:
    forming a first metallization layer generally conforming to the surface of the substrate;
    forming an etch stop barrier layer over at least selected regions of the first metallization layer, wherein said selected regions are at differing elevations as a result of the uneven substrate surface;
    forming a second metallization layer generally conforming to the etch stop barrier layer and the first metallization layer and having a thickness approximately equal to the variation in elevation on the uneven substrate surface;
    patterning the combined first and second metallization layers and etch stop barrier layer to define vertical metal interconnects over regions having different elevations and forming said vertical metal interconnects;
    forming a dielectric layer covering all vertical metal interconnects;
    planarizing the dielectric layer to expose only the higher vertical metal interconnects; and
    selectively etching the higher vertical metal interconnects back to the etch stop barrier layer intermediate the metallization layers.

8. A method as in claim 7, wherein a refractory barrier layer is formed over the substrate prior to forming the first metallization layer.

9. A method as in claim 7, wherein the thickness of the first metallization layer is approximately equal to the thickness of an intermetallic dielectric layer which is subsequently applied over the highest regions on the substrate.

10. A method as in claim 7, wherein the etch stop barrier layer is formed over the entire surface of the first metallization layer.

11. A method as in claim 7, wherein the etch stop barrier layer is formed only over the higher substrate regions which will have higher metal interconnects formed thereover.

12. A method as in claim 7, wherein the combined metallization layers and etch stop barrier layer are patterned by reactive ion etching through a photoresist mask.

13. A method as in claim 7, wherein the dielectric layer is silicon dioxide deposited by chemical vapor deposition.

14. A method as in claim 7, wherein the dielectric layer is planarized by applying a sacrificial layer and etching back the combined sacrificial layer and dielectric layer sufficiently to uncover the higher vertical interconnects while leaving the lower vertical interconnects covered.

15. A method as in claim 14, wherein the exposed vertical metal interconnects are aluminum or an aluminum-alloy and are etched back with a chlorine-containing plasma.

16. A method as in claim 15, wherein the etch stop barrier is tungsten-titanium and further comprising the step of etching back the etch stop barrier layer with a fluorine-containing plasma.

17. In a method for forming vertical metal interconnects over a semiconductor wafer substrate of the type wherein the interconnects are located over regions having different elevations, an improved method for planarizing the vertical metal interconnects comprising:
   forming a metallization layer conforming to the substrate and having an etch stop barrier layer which has been formed below the upper surface of the metallization layer by a distance equal to the expected height distance between at least some of the regions:
   patterning the metallization layer to define vertical metal interconnects over said regions having different elevations and forming said vertical metal interconnects; and
   selectively etching those vertical metal interconnects having higher elevations back to the etch stop barrier layer, whereby the height of the higher vertical interconnects is reduced to about the height of the lower vertical interconnects.

18. A method as in claim 17, wherein the metallization layer is aluminum or an aluminum alloy.

19. A method as in claim 17, wherein the etch stop barrier is tungsten-titanium.

20. A method as in claim 17, wherein the vertical metal interconnects are selectively etched by first forming a dielectric layer over all said interconnects, then applying a sacrificial layer over the dielectric layer, then etching the combined dielectric and sacrificial layers back to expose on the higher vertical interconnects, and finally etching the exposed interconnects back to the etch stop barrier.

21. A method as in claim 20, further comprising etching the exposed etch stop barrier back to the underlying metallization layer.

* * * * *